(12) United States Patent
Thurmaier

(10) Patent No.: US 11,493,554 B2
(45) Date of Patent: Nov. 8, 2022

(54) STORAGE UNIT AND DISPOSITION SYSTEM FOR STORING INTERFACE UNITS

(71) Applicant: Turbodynamics GmbH, Stephanskirchen (DE)

(72) Inventor: Stefan Thurmaier, Bad Aibling (DE)

(73) Assignee: Turbodynamics GMBH, Stephanskirchen (DE)

( * ) Notice: Subject to any disclaimer, the term of this patent is extended or adjusted under 35 U.S.C. 154(b) by 54 days.

(21) Appl. No.: 17/175,865

(22) Filed: Feb. 15, 2021

(65) Prior Publication Data

US 2021/0263101 A1 Aug. 26, 2021

(30) Foreign Application Priority Data

Feb. 21, 2020 (DE) .......................... 102020104641.3

(51) Int. Cl.
*G01R 31/28* (2006.01)
*G01R 31/319* (2006.01)
*G01R 31/3183* (2006.01)

(52) U.S. Cl.
CPC ... *G01R 31/31905* (2013.01); *G01R 31/2889* (2013.01); *G01R 31/2891* (2013.01); *G01R 31/318314* (2013.01)

(58) Field of Classification Search
CPC .. G01R 1/0408; G01R 1/0433; G01R 1/0483; G01R 1/07314; G01R 31/26; G01R 31/2808; G01R 31/2886
See application file for complete search history.

(56) References Cited

U.S. PATENT DOCUMENTS

| | | | |
|---|---|---|---|
| 7,196,508 B2 * | 3/2007 | Ham | G01R 31/2893 324/759.03 |
| 7,382,145 B2 | 6/2008 | Thurmaier | |
| 2005/0012498 A1 * | 1/2005 | Lee | G01R 31/2893 324/759.03 |
| 2016/0202290 A1 | 7/2016 | Kim et al. | |

FOREIGN PATENT DOCUMENTS

| | | |
|---|---|---|
| DE | 10 2019 119 134.3 | 1/2021 |
| WO | WO 2013/164407 A1 | 11/2013 |
| WO | WO 2015/025024 A2 | 2/2015 |

OTHER PUBLICATIONS

Search Report dated May 26, 2020 for German Application No. 10 2020 104 641.3 filed Feb. 21, 2020. 6 pages.

* cited by examiner

*Primary Examiner* — Tung X Nguyen
(74) *Attorney, Agent, or Firm* — HoustonHogle LLP

(57) ABSTRACT

A storage unit is used for storing a plurality of interface units. A disposition system then automatically manages interface units. A carrier is provided for accommodating an interface unit. The interface unit is configured for testing semiconductor elements in corresponding test devices. The storage unit is designed for storing a plurality of interface units, the storage unit having a plurality of compartments, each for accommodating one carrier, and each such carrier being designed to accommodate one interface unit. The storage unit comprises at least one alignment element for positionally accurate coupling of a handling device.

19 Claims, 4 Drawing Sheets

STORAGE UNIT AND DISPOSITION SYSTEM FOR STORING INTERFACE UNITS

RELATED APPLICATIONS

This application claims priority to German Application No. 10 2020 104 641.3, filed on Feb. 21, 2020, which is incorporated herein by reference in its entirety.

BACKGROUND OF THE INVENTION

Test devices for testing semiconductor elements usually comprise a test unit or a test head (tester) and a handler or prober. By means of such test devices, electronic components, such as integrated circuits or wafers, can be tested for their functionality. Such a test device has an interface unit, which is usually formed by an adapter board (board or load board or device interface board (DIB)) arranged in a stiffening frame (stiffener). The adapter board has a plurality of contact elements specifically arranged for a certain type of semiconductor elements, with which the semiconductor elements to be tested are contacted.

The interface unit is arranged in the area of the interface between the test unit and the feeding device. The contact elements are each arranged in a pattern specific to the semiconductor elements under test in order to be able to contact the contact points of the semiconductor elements correctly. The interface unit is detachably attached to either the test unit or the feeder, depending on the test device, so that the interface unit is interchangeable to allow different semiconductor devices to be tested.

Interface units of various designs are known in the art. The interface units are also referred to as test cards.

In order to be able to test different types of semiconductor elements with a test device, the interface unit must be exchanged, each of which is designed for a specific type of semiconductor element. Consequently, such interface units are often manufactured individually. They comprise a large number of contact points in a very small space. These interface units are therefore extremely expensive and also very sensitive. In a test center, there are often several tens or several hundreds of interface units for a test device.

International Publ. No. WO 2013/164407 A1 concerns a module for replacing such an interface unit in a test device. The module comprises a base element, a holder and guide elements. The guide elements are configured such that the interface unit is movable by a rectilinear translatory movement from an end position to an intermediate position on an intermediate position to a removal position, which is outside the test device. The mechanism includes a lever mechanism controlled by a coulisse that is mounted for a movement transverse to a straight translational motion of the test device. With this module, the interface unit can be reliably and easily removed from a test device in which the test unit and the feeder are separated by a distance, and another interface unit can be inserted. Since the movement of the interface unit is guided by the module, damage to the interface unit during removal and insertion into the test device is prevented.

International Publ. No. WO 2015/025024 A2 discloses a handling device for handling such an interface unit. This handling device is a movable carriage, which has elements for receiving an interface unit. The handling device has alignment elements for coupling the handling device to the test device in a positionally accurate manner. This ensures that the handling device is correctly positioned with respect to the test device in order to pick up or insert an interface element on the test device. This prevents damage when transferring the interface unit from the handling device to the test device in reverse. The handling device can be used to move the interface unit in order, for example, to deposit it on an inspection table for inspection of the interface unit.

From U.S. Pat. Appl. Publ. No. US 2016/0202290 A1 a probe card management apparatus is known comprising a storage unit for storing a plurality of probe cards and a transfer unit for transferring the probe cards in between the storage unit and the transfer unit. The transfer unit is a rail based system having a slider hanging on. The slider comprises gripping means for gripping the probe cards from above.

SUMMARY OF THE INVENTION

The present invention relates to a storage unit for storing a plurality of interface units, and a disposition system for automatically handling interface units.

The present invention is based on the object of creating a storage unit and/or a disposition system for automatic management of interface units, with which a larger number of interface units can be kept in stock, whereby damage to the interface units is to be reliably avoided.

According to first aspect of the present invention, there is provided a storage unit for storing a plurality of interface units used for testing semiconductor elements in test devices, wherein the storage unit comprises a plurality of compartments, each for accommodating one interface unit, a loading module which is configured to be movable along the plurality of compartments of the storage unit (10) by a traversing mechanism, so that interface units can be supplied to and withdrawn from the individual compartments by the loading module, a transfer area is provided at the side range of the storage unit, so that an interface unit can be transferred between the outer area and the inner area of the storage unit, at least one alignment element for positionally accurate coupling of a handling device for handling an interface unit is provided nearby to the transfer area, so that a handling device coupled thereto can exchange an interface unit with the storage unit.

The at least one alignment element is provided at nearby or adjacent the transfer area for positionally accurate coupling of a handling device for handling an interface unit, so that a handling device coupled thereto can exchange an interface unit with the loading module located in the exchange area. This allows the handling device to be positioned and fixed to the storage unit in a defined manner. The transfer of an interface unit from the handling device to the storage unit and vice versa is thus clearly defined and can be repeated without damage. Such handling devices are known, for example, from WO 2015/025024 A2, which is incorporated herewith in its entirety.

The alignment element has two functions, namely a firm fixation of the handling device to the storage unit and the exact positioning of the handling device with respect to the storage unit. Thus the alignment element could also be named as a "coupling element" for coupling the handling element to the storage unit.

The loading module preferably comprises two slide rails, along each of which a carrier can be pushed into or pulled out of the loading module. When transferring an interface unit from a loading module to a compartment or when transferring an interface unit from a compartment to a loading module, the two slide rails of the loading module are preferably arranged in alignment with two corresponding slide rails of the corresponding compartment, so that the carrier loaded with the interface unit can be moved from one pair of slide rails to the other pair of slide rails.

The loading module preferably comprises a movement device for moving a carrier into or out of the loading module. The movement device can be designed with a gripping finger for engaging in a corresponding coupling element on the carrier, the gripping finger being designed to be movable on the loading module for loading and unloading the loading module. This allows a carrier to be moved with respect to the loading module by means of the gripper finger. The gripper finger is preferably arranged to be pivotable in a plan view so that it can be arranged in different directions in order to move a carrier in different directions with respect to the loading module.

The traversing mechanism of the loading module is preferably configured such that the loading module is traversable into an exchange area, wherein the exchange area is arranged at the side range or periphery, respectively, of the storage unit such that the exchange area is adjacent to a transfer area so that an interface unit from the loading module located in the exchange area can be received by the transfer area or delivered to the transfer area. The transfer area may be located outside the compartments of the storage unit. However, the transfer area can also be formed in one of the compartments, the transfer area being coupled to the outside of the storage unit by means of a drawer device, so that carriers with an interface unit thereon can be inserted or removed from the outside into the compartment forming the transfer area.

The storage unit preferably has a scanning device for scanning a machine-readable code which is applied to the carriers and/or to the interface units. The scanning device is preferably provided in the area of the loading module, so that any interface unit or carrier moved by means of the loading module can be identified.

The scanning device may comprise a camera that can capture an optical code. However, the scanning device may also be an RFID scanner or other scanning device for capturing a machine-readable code.

An optical code is preferably represented by pixels with a diameter of at least 1 mm. In particular, the pixels can also be larger, such as at least 2 mm or at least 3 mm. An optical mark, which is generated from such large image dots, can be detected by a camera from a large distance. This means that the positioning of the camera can also be provided some distance away from the interface units or the carriers to be scanned, and the machine-readable code can still be reliably identified. This simplifies the design of the storage unit and the evaluation of the optical code detected thereby.

Each compartment preferably has two slide rails, along each of which a carrier can be pushed into or pulled out of the compartment. The slide rails can be provided with ball bearings which protrude slightly from the surface of the slide rails so that the carriers slide along the slide rails on the ball bearings. The slide rails can also be provided with an electrically conductive sliding lining which reduces the friction between the carriers and the slide rails. This sliding lining can be provided in place of the ball bearings or in combination with the ball bearings. The combination with ball bearings on the slide rails and a sliding lining on the carrier or ball bearings on the carrier and a sliding lining on the slide rails is preferred, since such a combination of a sliding lining and ball bearings causes very low abrasion and is therefore suitable for a clean room. In this case, the sliding lining is preferably made of plastic.

One or more compartments may be provided with a detent device and/or a locking device for fixing a carrier in the respective compartment. Such a detent and/or locking device allows operation in an earthquake-prone area, since the interface units are fixed in the storage unit by both the detent device and the locking device, so that there is no risk of them falling out of the storage unit in case of slight fluctuations of the storage unit.

Such a detent device is, for example, a magnet which interacts with a detent magnet attached to the carrier in such a way that the magnetic action of the two magnets latches the respective carrier in the respective compartment.

Instead of a detent device or as a supplement, a locking device can also be provided on the compartments, with which the respective carrier is fixed or locked in the compartment in such a way that it can no longer be moved out.

The storage unit preferably comprises a loading module that is designed to be movable along the multiple compartments of the storage module by means of a traversing mechanism, so that interface units can be fed to and withdrawn from the individual compartments by means of the loading module. This allows the one loading module to load each compartment individually with an interface unit located on a carrier.

According to a further aspect of the present invention, a carrier for accommodating an interface unit for a storage unit is provided for storing such interface units which are used for testing semiconductors in the corresponding test devices. The carrier is provided with one or more positioning members, which are formed for positively receiving an interface unit.

By using such a carrier with positioning members, the interface unit can be handled on the carrier for storage in a storage unit. This means that the interface unit does not need to be handled, thus avoiding damage to the interface unit, since the interface unit itself does not have to be touched.

The positioning members are designed in such a way that the interface unit is positively (form-locking) held thereon. This ensures that the interface unit is uniquely positioned on the respective carrier and is also sufficiently fixed for handling of the unit consisting of the interface unit and the carrier. The positioning members preferably correspond to positioning elements of the test device for receiving an interface unit, the positioning members being arranged on the carrier in the same shape and arrangement as the corresponding positioning elements of the test device are arranged on the test device. In this way, the positioning members on the carrier simulate the pick-up area for the interface unit on the test device. As a result, the same interface units that can be attached to the test device can also be arranged on the carrier. Typically, a large number of positioning elements are provided on the test device, with only a small number of positioning members preferably being arranged on the carrier.

It has been shown in practice that it can be useful to provide at least one or two positioning pins as positioning elements, which are designed in such a way that they engage in corresponding positioning holes on the interface unit. Preferably, spacer elements are provided as further positioning members, which have a blunt surface so that the interface unit can be placed on them without damage and is arranged at a predetermined distance from the surface of the carrier. However, any other type of positioning members, in particular positioning members which delimit a right-angled corner or special shaped bodies which are adapted to a special section of the interface unit, can also be provided.

At least one of the positioning members is preferably formed of an electrically conductive material. This ensures that the interface unit is electrically connected to the carrier. The carrier is formed of an electrically conductive material, so that an electrically conductive connection exists between the carrier and an interface unit located thereon. Preferably, the carrier is grounded when positioned in a storage unit described in more detail below so that the interface unit is also connected to electrical ground. The carrier may be provided with a sliding lining on its underside. This sliding coating is arranged in the form of a strip at the edge of the carrier, at which the carrier can rest on a sliding rail, which is explained in more detail below. The sliding lining is preferably made of a plastic material which is especially electrically conductive.

Sometimes, however, it may also be expedient for one or more positioning members to be electrically insulating.

By providing certain positioning members which correspond to the positioning elements of the test device, interface units with different geometry can be accommodated on the carrier as well as on the test device.

The carrier preferably comprises a coupling element for coupling with a movement device for moving such a carrier. The coupling element is designed as a bore, for example. Several such coupling elements may also be provided on the carrier.

The carrier preferably has a detent device for coupling to a corresponding counter-detent device. The detent device can be designed as a detent magnet or also as a mechanical detent device.

Preferably, the carrier is formed mirror-symmetrically in a plan view, with the positioning elements also being arranged and formed in a mirror-symmetrical arrangement on the carrier. In particular, the coupling elements and/or detent devices are also arranged on the carrier in a mirror-symmetrical arrangement.

The carrier preferably has a base body which is rectangular in a plan view.

In particular, the carrier is formed as a rectangular frame made of an electrically conductive metal plate (e.g., aluminium or steel).

According to another aspect of the present invention, there is provided a disposition system for automatically managing interface units comprising:
- a storage unit having a plurality of carriers,
- a self-propelled handling device, and
- a central control device which is designed such that interface units can be automatically transported back and forth between a test device and the storage unit by means of the handling device and are automatically exchanged between the handling device and the storage unit.

This enables fully automatic exchange and depositing of the interface units. The risk of damage to the interface units is reduced to a minimum.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
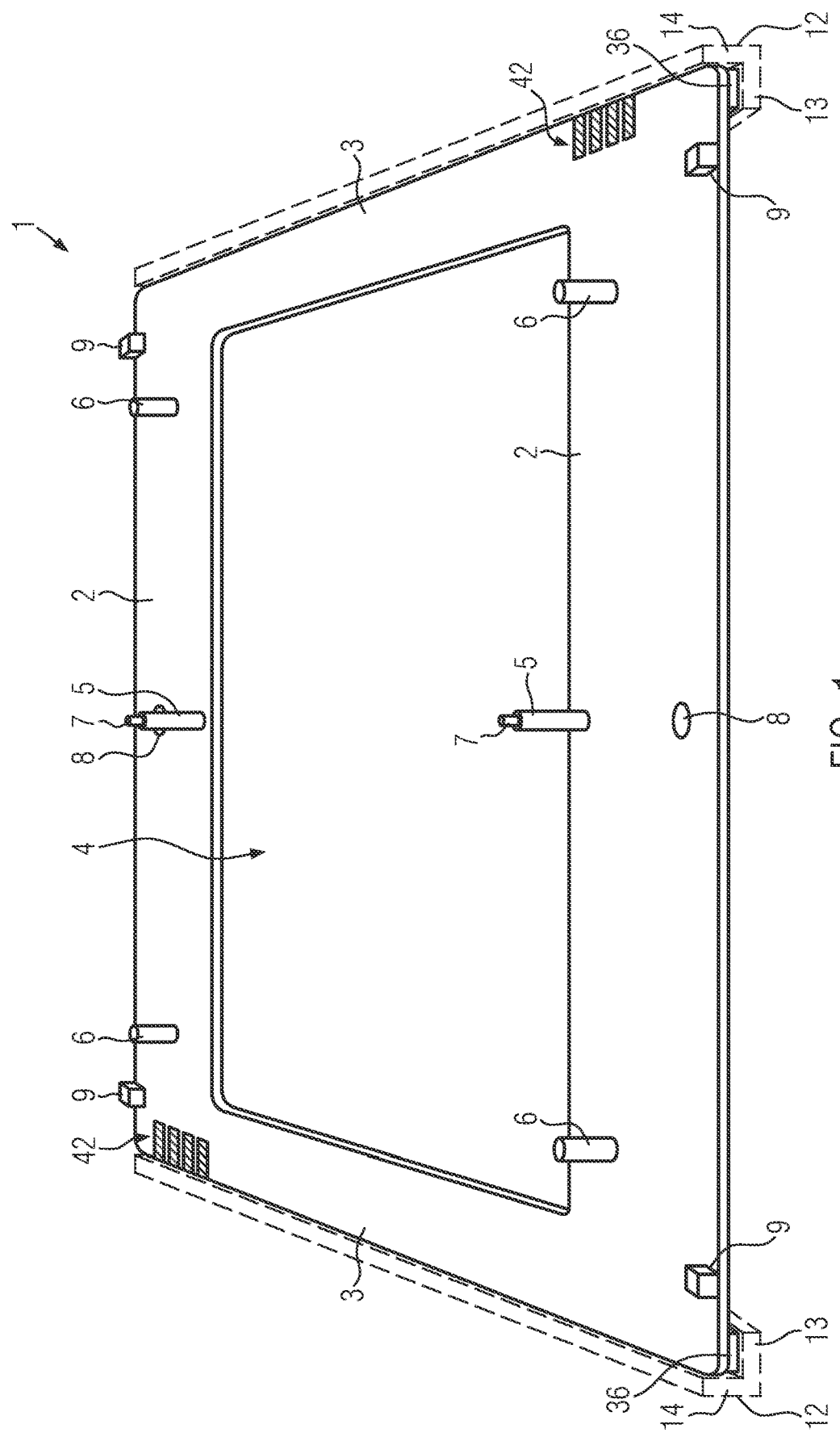
FIG. 1 a carrier for an interface unit in perspective view.

A carrier 1 according to an embodiment of the present invention has a body which is rectangular in a plan view, forming a frame with two longitudinal struts 2 and two transverse struts 3. This body is cut from a steel plate so that the longitudinal struts 2 and the transverse struts 3 form a one-piece plate-shaped body (FIG. 1). The carrier 1 bounds a through-opening 4.

In the present embodiment, two positioning pins 5 and four spacers 6 are attached to the carrier 1 as positioning members. The positioning pins 5 are metal pins which protrude vertically from the surface of the carrier 1 and are slightly thinner at their portion spaced from the carrier than at the remaining portion. These thin sections of the positioning pins 5 form plug-in pins 7, which are inserted into corresponding holes of an interface unit in order to position it exactly on the carrier 1. The spacers 6 are plastic pins with a larger diameter compared to the positioning pins 5. The spacers 6 are also perpendicular to the surface of the carrier. However, they are shorter than the positioning pins 5 and keep an interface unit at a distance from the frame-shaped body of the carrier 1.

The two positioning pins 5 are each arranged in the longitudinal centre of the longitudinal struts 2.

The spacers 6 are arranged close to the corner regions of the carrier 1 in order to span as large a support surface as possible, with which they support an interface unit.

Adjacent to the positioning pins 5 and adjacent to the outer edge area of the longitudinal struts 2, a through-hole is formed in each case, which serve as coupling elements 8. Their function is explained in more detail below.

In the area of the corners of the carrier 1, one magnet each is provided adjacent to the outer edge of the longitudinal struts 2, which serve as a detent device 9. These magnets can interact with corresponding counter-magnets to create a latching connection.

Such a support 1 serves to accommodate an interface unit. An interface unit usually consists of an adapter plate and a stiffening frame. The adapter plate is also called a load board or a device interface board (DIB). Because the positioning pins 5 engage positively in an interface unit arranged on the carrier 1, the interface unit is clearly positioned on the carrier 1 and cannot slip. The carrier 1 can thus be reliably and safely handled and moved together with the interface unit without the interface unit being damaged in the process.

The carrier has a sliding lining 36 on the underside at the outer edge region of the longitudinal struts. It is a continuous strip extending along the entire length of the longitudinal strut.

The sliding lining is made of a material with a low coefficient of friction. In the present embodiment example, the sliding lining is formed from plastic. The sliding layer is electrically conductive. The sliding lining may also be formed of a metal, in particular a metal alloy, such as brass.

Within the scope of the invention, the carrier 1 can also have a different arrangement of the positioning members 5, 6 than in the embodiment example shown in FIG. 1. The positioning members may also be arranged non-symmetrically in order to define a unique orientation of the interface unit on the respective carrier 1.

Several coupling elements 8 can also be provided, the arrangement of which also does not always have to be symmetrical.

Figure 2:
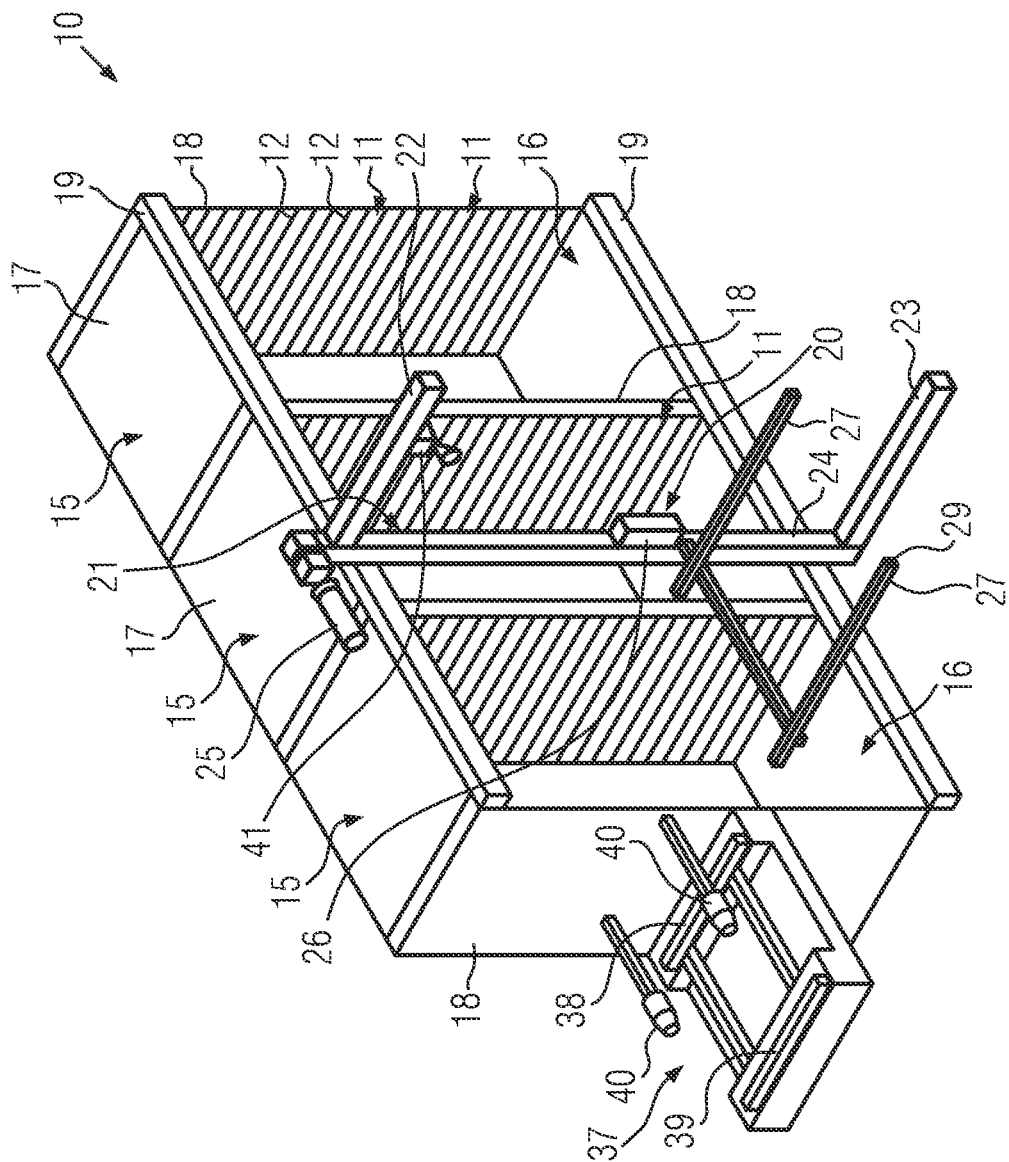
FIG. 2 a part of a storage unit in a schematic perspective view.
Figure 3:
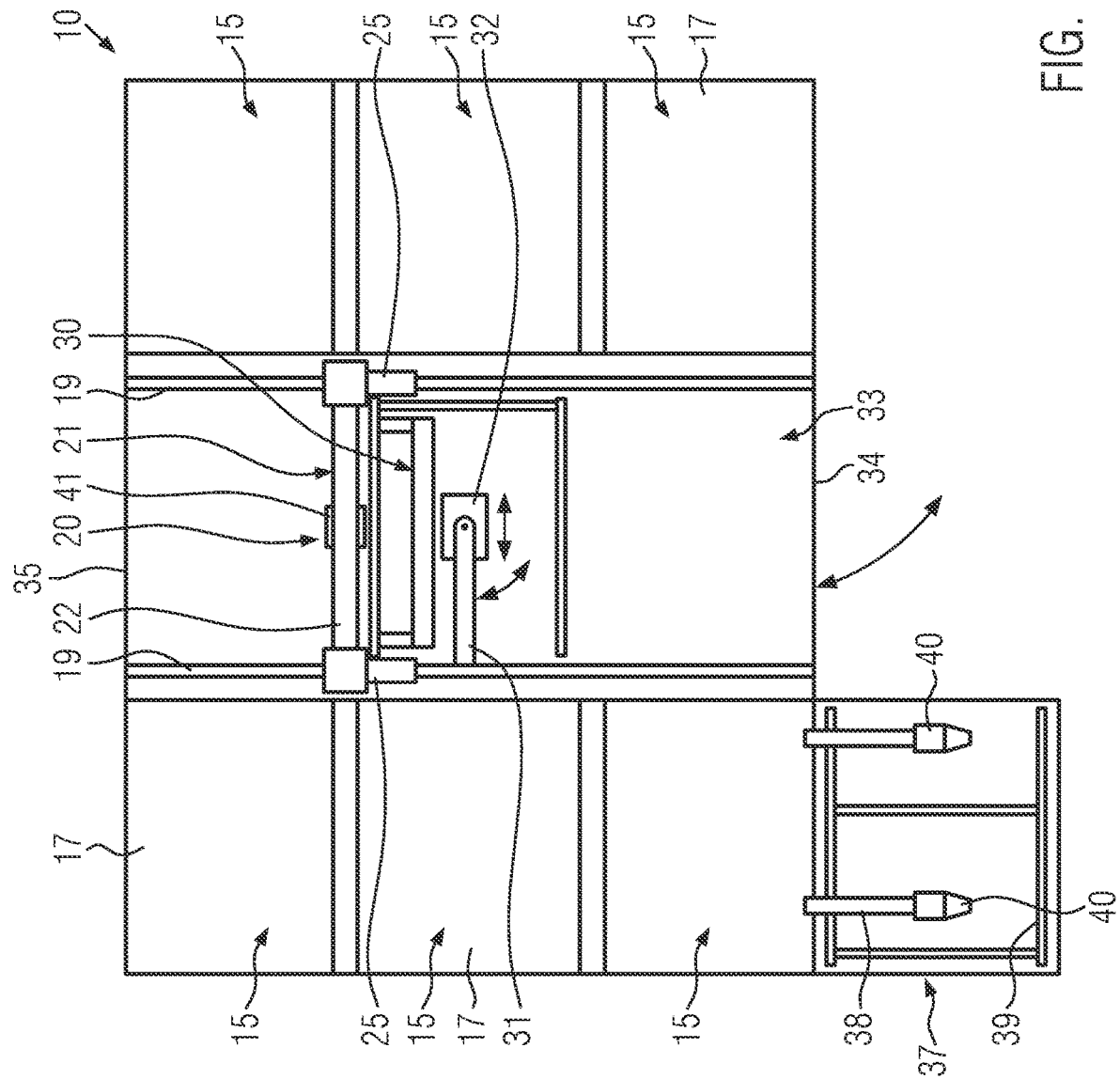
FIG. 3 a schematic top view of a storage unit.

This carrier 1 is used for storing an interface unit in a storage unit 10 (FIGS. 2, 3).

The storage unit 10 is a kind of micro high-rack storage with many compartments 11, each for holding a carrier 1 together with an interface unit. Each compartment 11 has two slide rails 12, which are arranged in the storage unit 10 in such a way that the beams are received by the slide rails 12 with their lateral longitudinal edges along the transverse struts 3 with some play (FIG. 1). The slide rails have an L-shaped cross-sectional form with a base body 13 of approximately rectangular cross-section and an upwardly projecting leg 14. The leg 14 of each slide rail 12 is arranged on the slide rails 12 of a compartment 11 at the outer edge in each case, so that the remaining region of the base body 13 is exposed and forms a receiving surface for the edge region of the carrier 1. Ball bearings may be attached to the base body 13 of the slide rails 12, which project slightly from the bearing surface so that the carrier can slide along the slide rails 12 by means of the ball bearings. The support surface may alternatively be provided with a sliding layer of plastic. The sliding layer should preferably be electrically conductive.

FIG. 2 schematically shows a section of the storage unit 10 with three columnar cabinet-like storage cabinet elements 15. These three storage cabinet elements 15 are arranged side by side. They each have a bottom wall 16, top wall 17, two side walls 18 and a rear wall (not shown).

Slide rails 12 are attached to the inner surfaces of the side walls 18, so that in each case a carrier 1 can be inserted and pulled out horizontally between two opposing slide rails 12 in a manner similar to a drawer. The side walls 18 and the slide rails 12 are electrically conductive and connected to the electrical ground, so that a carrier located on the slide rails 12 is grounded.

Magnets are provided on the rear walls as mating latching elements or detent elements, respectively, so that when a carrier 1 is pushed into one of the compartments 11, it is held in its end position by a latching engagement by the corresponding pairs of magnets. In this way, each carrier 1 is individually fixed in a latching manner.

In the area of the rear wall, a locking device is provided, which consists, according to one specific example, of a rod extending from the bottom wall 16 to the top wall 17 (not shown), on which a plurality of downwardly pointing hooks are arranged. These hooks are designed and arranged in such a way that, when the locking device is lowered, the hooks engage in a respective through-opening 8 of the carriers 1 and lock these against being pushed out of the respective compartment 11. The locking device serves to completely lock all carriers 1 located in a storage cabinet element 15. The locking device is only released, i.e. the hooks are pulled out of the through openings with it, when the storage cabinet element 15 is used to insert carriers 1 therein or to pull them out.

With the locking device, the carriers 1 are held in the respective storage cabinet element 15 in such a way that they cannot fall out of the respective storage cabinet element 15 even during an earthquake.

The embodiment of the storage unit 10 shown in FIG. 3 has two rows with three such storage cabinet elements 15 each, which are arranged with their open front sides facing each other. A corridor 33 is formed between the front sides of the two rows of storage cabinet elements 15.

Horizontal guide rails 19 are arranged at the upper and lower edges of each of the front sides. These guide rails 19 serve to guide a loading module 20. The loading module has a rectangular module frame 21 with an upper cross member 22 and lower cross member 23 and two elongated vertical members 24. The module frame 21 can be moved along the horizontally extending guide rails 19 by means of drive devices 25.

The vertical beams 24 serve as vertical guide rails for one slide 26 each. The slide 26 of the loading module 20 jointly hold a loading platform 27. The loading platform 27 has two slide rails 28, 29 which are designed and arranged in the same way as the slide rails 12 of a compartment 11 and each serve to receive a carrier 1. A conveyor 30 is provided in the area between the slide rails 28, 29 for conveying a carrier into the loading module or out of the loading module.

The conveying device 30 has a gripper finger 31 which is arranged about a vertical axis on a slide 32 which can be moved in the horizontal direction. The slide 32 can be moved parallel to the slide rails 28, 29, whereby it can only be moved within the area covered by the slide rails 28, 29.

If a carrier 1 is to be pulled out of a compartment 11, then the loading platform 27 is arranged adjacent to the respective compartment 11. The slide 32 is arranged approximately in the centre of the loading platform 27 and the gripper finger 31 is swivelled with its free end in the direction of the compartment 11 that must be emptied (FIG. 3: Gripper finger 31 points to the left). The gripping finger 31 engages with a pin (not shown) projecting upwards at the free end of the gripping finger in the coupling element 8 or in the hole 8, which is formed on the longitudinal strut 2 of the carrier 1 arranged adjacent to the loading platform 27. The slide 32 is then pulled out a little from this compartment 11, so that the longitudinal strut 2 on which the gripping finger 31 has engaged is located approximately in the central area of the corridor 33 between the two rows of storage cabinet elements 15.

The engagement of the gripper finger 31 with the carrier 1 is solved and the slide 32 with the gripper finger 31 is again moved in the direction of the compartment 11 from which the carrier 1 has been pulled out. This brings the gripper finger 31 with its free end into the area of the other longitudinal strut 2 of the carrier 1, so that the gripper finger 31 can engage with the coupling element or hole 8 on this longitudinal strut 2. The slide 32 is then moved back a short distance to the center of the loading platform, so that the entire carrier 1 is pulled on the loading platform 27.

The loading platform can then be moved freely with the carrier 1 in the storage unit 10.

When inserting a carrier 1 into a compartment 11, the steps explained above for withdrawing a carrier 1 from the compartment 11 are performed in reverse order.

If a compartment 11 is to be emptied or filled on the other side of the loading platform 27 or on the other side of the corridor 33, then the gripper finger 31 is swivelled 180° so that it points to the opposite side. The steps explained above for pulling out or inserting a carrier 1 can then be carried out in the same way.

The corridor 33 of the storage unit 10 can be closed at its front side by a pivotable door 34. At the rear, the corridor is closed off by a wall 35 which extends between the two rows.

The module frame 21 is arranged at the rear of the loading platform 27. A horizontal transfer platform 37 is attached to one of the storage cabinet elements 15. This transfer platform 37 in turn has two slide rails 38, 39 for receiving a carrier 1.

The transfer platform 37 is designed as a drawer so that it can be slid into the interior of the corresponding storage cabinet element 15, where it occupies the position of one of the compartments 11.

When the transfer platform is in the storage cabinet element, the slide rails 28, 29 of the loading platform 27 can be aligned with the slide rails 38, 39 of the transfer platform form 37. This allows a carrier 1 to be interchanged between the transfer platform 37 and the loading platform 27 in the same manner as the insertion and extraction of a carrier from one of the compartments 11 is performed.

Alignment elements 40 are provided on the transfer platform 37 or adjacent to the transfer platform 37 on the storage cabinet element 15 for coupling a handling device in a precise position. Such a handling device is known, for example, from WO 2015/025024 A2. The handling device can be coupled to the transfer platform 37 with positional accuracy by means of the alignment elements 40. By this, an interface unit can be placed on or taken from a carrier 1 located in the area of the transfer platform 37. Due to the alignment elements 40, the position of the handling device is clearly defined with respect to the transfer platform 37 and thus with respect to the storage unit 10. Furthermore, the handling device is hold tight by alignment elements 40 to which it is coupled.

Thus, the exchange of an interface unit between the handling device and the storage unit 10 can be performed reliably and without damage. To pick up an interface unit, it is only necessary to present a carrier 1 at the transfer platform 37 which is not yet occupied by an interface unit. After the interface unit has been placed on the free carrier 1, the carrier with the interface unit can be pulled onto the loading platform 27 and brought with it to one of the compartments 11 to be stowed therein.

Attached to the upper cross member 22 of the loading module 20 is a camera 41 which is oriented with its viewing direction downward. The camera scans a kind of bar code 42 which is applied to the carrier 1. This bar code comprises light and dark stripes with a thickness of at least one, preferably several millimetres. Since the number of carriers 1 is limited, it is perfectly sufficient if a binary number with no more than 12 digits is encoded in the bar code. For most applications, even a barcode with which only a binary number with 10 digits is encoded is sufficient. A barcode displayed with such wide lines can be reliably recognized from a great distance, which is why there is no need to readjust the camera 41. A simple lens that does not need to be readjusted is sufficient to detect the barcode on the respective carriers 1, even if the carrier should be at the very bottom or at the very top in the area of the storage unit 10.

Figure 4:
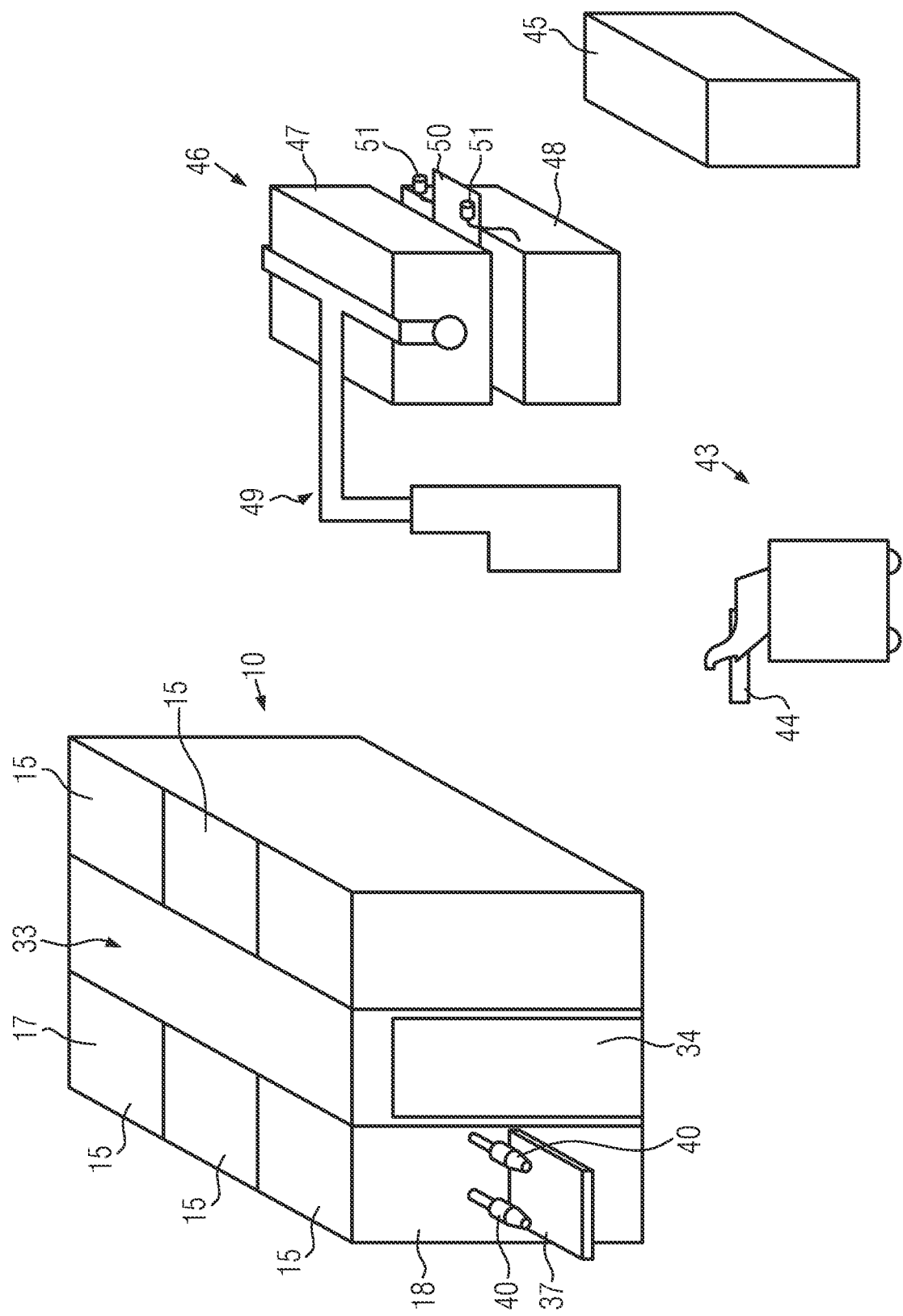
FIG. 4 a disposition system with a storage unit, a handling device, a test device and a central control device in a schematic perspective view.

The positionally accurate alignment elements 40 are preferably similar to docking elements for connecting a test head and a feeder of a test device, as known for example from U.S. Pat. No. 7,382,145 B2. Such docking elements can be opened and closed automatically. Hereby, it is possible that the handling device 43 is designed as a self-propelled vehicle and drives to the storage unit 10 in order to automatically couple there to the storage unit 10 by means of the alignment elements 40 (FIG. 4). The handling device can be a trolley which can be coupled to an AGV automatic guided vehicle). Such trolleys are shown in WO 2015/025024 A2.

The transfer of an interface unit 44 between the handling device 43 and the transfer platform 37 of the storage unit 10 is fully automatic. The depositing of the carriers 1 with the interface units 44 in the compartments 11 or the retrieval of the carriers 1 with the interface units again is also fully automatic. This can be controlled by a central control device 45, so that an interface unit 44 to be exchanged is brought fully automatically to the storage unit 10 by a test device 46, is exchanged there with another interface unit 44 and the handling device 43 conveys the exchanged interface unit 44 to the test device 46. In this way, errors in operation are eliminated, the interface units 44 can be reliably conveyed between the storage unit 10 and the test device(s) 46 without damage, and moreover, a plurality of interface units 44 can be stored in a confined space in the storage unit 10.

The test device comprises a test head 47 and a feeding device 48. The test head is also named as "tester" or "prober" and the feeding device as "handler". In the embodiment example shown in FIG. 4, the test head 47 is arranged on the feeding device 48 so that a horizontal interface surface is formed between the test head 47 and the feeding device 48. Different arrangements of the test head 47 and the feeding device 48 are known, such as with a vertical interface surface, which can be used equally.

In the present embodiment, a manipulator 49 is provided to lift the test head 47 off the feeding device 48 a bit when the interface unit 44 is to be replaced. For this purpose, a drawer mechanism 50 may be provided on the test device, such as is shown, for example, in WO 2013/164407 A1 or DE 10 2019 119 134.3. The drawer mechanism 50 is preferably designed to be fully automatic, so that it independently detaches the interface unit from the test head 47 or from the feed device 48, removes it and moves it out a little to the side like a drawer.

Alignment elements 51 are arranged on the test device 46, in particular the stationary part standing on the floor, which in the present embodiment is the feed device 48, which are designed in exactly the same way as the alignment elements 40 in order to position the handling device 43 precisely with respect to the test device 46, so that a reliable and automatic transfer of the interface unit between the drawer mechanism 50 of the test device 46 and the handling device 43 is possible.

After an interface unit 44 has been replaced, the test head 47 and the feeding device 48 are automatically moved together by means of the manipulator 49, and the test operation can be resumed.

The central control device 45 has a data link to the storage unit 10, the handling device 43, the test device 46 and the manipulator 49. The data link may be a radio link and/or may be cabled. Within the scope of the invention, the disposition system shown in FIG. 4 can also be designed to be only partially automatic, in which case, for example, the manipulator 49 and/or the handling device 43 and/or the drawer mechanism 50 are designed to be non-automatically operable.

The test device 46 can also be designed in such a way that it is not necessary to move the test head 47 and the feeding device 48 apart in order to eject or insert the interface unit, for example with a drawer mechanism 50.

The test device 46 may also be provided with an internal lifting device to move the test head 47 and the feeding device 48 apart in order to eject or insert the interface unit, for example, with a drawer mechanism 50.

With these two test devices 46, it is not necessary to use a manipulator to exchange the interface units fully automatically (controlled by the central control device 45) at the test device 46 and to transport them back and forth between the test device 46 and the storage unit 10.

In the above embodiment the transfer platform 37 is configured as a drawer. It is also possible to provide a fixed platform which is not movable but which has a conveying means for exchanging the interface unit or the carrier and the interface unit placed on the carrier between the inner area of the storage unit and the transfer platform which is located outside if the storage unit.

The storage unit comprises a door adjacent to the transfer platform which is automatically opened and closed so that the interface unit or the carrier and the interface unit placed on the carrier can be moved between the inner area of the storage unit and the transfer platform.

While this invention has been particularly shown and described with references to preferred embodiments thereof, it will be understood by those skilled in the art that various changes in form and details may be made therein without departing from the scope of the invention encompassed by the appended claims.

| List of reference signs | |
|---|---|
| 1 | carrier |
| 2 | longitudinal strut |
| 3 | transverse strut |
| 4 | Through opening |
| 5 | positioning pin |
| 6 | Spacer |
| 7 | Plug pin |
| 8 | Coupling element |
| 9 | detent device |
| 10 | Storage unit |
| 11 | compartment |
| 12 | Slide rail |
| 13 | Base body |
| 14 | Leg |
| 15 | Storage cabinet element |
| 16 | Bottom wall |
| 17 | top wall |
| 18 | Side wall |
| 19 | Guide rail |
| 20 | Loading module |
| 21 | Module frame |
| 22 | Upper cross member beam |
| 23 | Lower cross beam |
| 24 | Vertical beam |
| 25 | Drive unit |
| 26 | slide |
| 27 | Loading platform |
| 28 | Slide rail |
| 29 | Slide rail |
| 30 | Conveyor device |
| 31 | Gripper finger |
| 32 | Slide |
| 33 | Corridor |
| 34 | Door |
| 35 | Wall |
| 36 | Sliding lining |
| 37 | Transfer platform |
| 38 | Slide rail |
| 39 | Slide rail |
| 40 | Alignment element |
| 41 | Camera |
| 42 | Bar code |
| 43 | Handling device |
| 44 | interface element |
| 45 | Central control device |
| 46 | test device |
| 47 | test head |
| 48 | feeding device |
| 49 | manipulator |
| 50 | drawer mechanism |
| 51 | Alignment element |

What is claimed is:

1. A storage unit for storing a plurality of interface units which are used for testing semiconductor elements in corresponding test devices, wherein the storage unit comprises:
    a plurality of compartments, each for accommodating one interface unit,
    a loading module that is configured to be movable along the plurality of compartments of the storage unit by a traversing mechanism, so that interface units can be supplied to and withdrawn from the individual compartments by the loading module,
    a transfer area is provided at the side range of the storage unit, so that an interface unit can be transferred between the outer area and the inner area of the storage unit, and
    at least one alignment element for positionally accurate coupling of a handling device for handling an interface unit is provided nearby to the transfer area, so that a handling device coupled thereto can exchange an interface unit with the storage unit.

2. The storage unit according to claim 1, wherein each compartment has two slide rails along which a respective carrier can be pushed into or pulled out of the compartment, wherein the carriers are configured for accommodating an interface unit.

3. The storage unit according to claim 1, wherein one or more compartments are provided with a detent device and/or a locking device for fixing a carrier in the respective compartment.

4. The storage unit according to claim 1, wherein the loading module has two slide rails along each of which a carrier can be pushed into or pulled out of the loading module.

5. The storage unit according to claim 1, wherein the loading module comprises a conveying device for conveying a carrier into or out of the loading module.

6. The storage unit according to claim 5, wherein the conveying device comprises a gripping finger for engaging in a corresponding coupling element on the carrier, the gripping finger being designed to be movable with a carrier for loading and unloading the loading module.

7. The storage unit according to claim 1, wherein the transfer area comprises a transfer platform, which comprises a horizontal upper side for accommodating a carrier and/or an interface unit.

8. The storage unit according to claim 7, wherein the transfer platform is configured as a drawer in such a way that it can be moved into the inner area of the storage unit.

9. The storage unit according to claim 7, wherein the transfer platform comprises a conveyer means for exchanging an interface unit with the storage unit.

10. The storage unit according to claim 1, wherein the storage unit comprises a scanning device for scanning a machine-readable code on a carrier and/or on an interface unit.

11. The storage unit according to claim 10, wherein the scanning device comprises a camera.

12. The storage unit according to claim 11, wherein the code is represented with pixels having a diameter of at least 1 mm.

13. The storage unit according to claim 1, wherein each compartment has two slide rails along which a respective carrier can be pushed into or pulled out of the compartment, wherein the carriers are configured for accommodating an interface unit, and wherein the carrier is provided with one or more positioning members which are configured to receive an interface unit in a form-fitting manner.

14. The storage unit according to claim 13, wherein at least one of the positioning members is formed from an electrically conductive material.

15. The storage unit according to claim 13, wherein the positioning members are configured in the form and arrangement relative to one another in the same way as corresponding positioning elements of the test device for receiving an interface unit on the test device.

16. The storage unit according to claim 13, wherein the carrier comprises a coupling element for coupling to a movement device for moving such a carrier, the coupling element being configured, for example, as a hole.

17. The storage unit according to claim 1, wherein each compartment has two slide rails along which a respective carrier can be pushed into or pulled out of the compartment, wherein the carriers are configured for accommodating an interface unit, and wherein the carrier has a detent device for coupling to a corresponding counter-detent device, the detent device being designed, for example, as a detent magnet or an elastic detent means.

18. The storage unit according to claim 1, wherein each compartment has two slide rails along which a respective carrier can be pushed into or pulled out of the compartment, wherein the carriers are configured for accommodating an interface unit, and wherein the carrier has a base body which is rectangular in a plan view.

19. A disposition system for automatic handling of interface units, comprising
  at least one storage unit with a plurality of carriers,
  an independently movable handling device, and
  a central control device which is designed in such a way that interface units can be automatically transported back and forth between a test device and the storage unit by means of the handling device and are automatically exchanged between the handling device and the storage unit;
wherein the storage unit comprises:
  a plurality of compartments, each for accommodating one interface unit,
  a loading module that is configured to be movable along the plurality of compartments of the storage unit by a traversing mechanism, so that interface units can be supplied to and withdrawn from the individual compartments by the loading module,
  a transfer area is provided at the side range of the storage unit, so that an interface unit can be transferred between the outer area and the inner area of the storage unit, and
  at least one alignment element for positionally accurate coupling of a handling device for handling an interface unit is provided nearby to the transfer area, so that a handling device coupled thereto can exchange an interface unit with the storage unit.

* * * * *